United States Patent
Hsu (10) Patent No.: US 6,177,899 B1
(45) Date of Patent: Jan. 23, 2001

(54) ANALOG-TO-DIGITAL CONVERTER HAVING MULTIPLE REFERENCE VOLTAGE COMPARATORS AND BOUNDARY VOLTAGE ERROR CORRECTION

(75) Inventor: Pochin Hsu, Hsinchu (TW)

(73) Assignee: Etrend Electronics, Inc., Hsin-Chu (TW)

(*) Notice: Under 35 U.S.C. 154(b), the term of this patent shall be extended for 0 days.

(21) Appl. No.: 09/124,366

(22) Filed: Jul. 29, 1998

(51) Int. Cl.⁷ .................................................. H03M 1/14
(52) U.S. Cl. .......................................... 341/156; 341/163
(58) Field of Search ...................... 341/156, 163

(56) References Cited

U.S. PATENT DOCUMENTS

| | | | |
|---|---|---|---|
| 4,507,649 | 3/1985 | Dingwall et al. | 340/347 |
| 4,523,107 | 6/1985 | Peterson | 307/352 |
| 4,639,715 | 1/1987 | Doluca | 340/347 |
| 4,903,028 | 2/1990 | Fukushima | 341/156 |
| 5,086,299 * | 2/1992 | Frigerio et al. | 341/156 |
| 5,291,198 | 3/1994 | Dingwall et al. | 341/159 |
| 5,355,135 | 10/1994 | Redfern | 341/156 |
| 5,463,395 * | 10/1995 | Sawai | 341/156 |
| 5,682,163 * | 10/1997 | Hsu | 341/156 |
| 5,726,653 | 3/1998 | Hsu et al. | 341/156 |

* cited by examiner

Primary Examiner—Howard L. Williams
(74) Attorney, Agent, or Firm—George O. Saile; Stephen B. Ackerman; Billy Knowles (57) ABSTRACT

An A/D converter having multiple conversions is described. The first conversion determines the Most Significant Bits of the output digital code and a second conversion determines the Least Significant Bits of the output digital code. A multiple reference voltage comparator for use in an A/D converter is described. The multiple reference voltage comparator allows one set of voltage comparators to be used in creating coarse and fine thermometer codes that respectively determine the Most Significant Bits and the Least Significant Bits of the digital code. Further, a set of error detection voltage comparators is provided to determine errors in the coarse thermometer code and allow correction during encoding of the Most Significant Bits.

15 Claims, 8 Drawing Sheets

ANALOG-TO-DIGITAL CONVERTER HAVING MULTIPLE REFERENCE VOLTAGE COMPARATORS AND BOUNDARY VOLTAGE ERROR CORRECTION

BACKGROUND OF THE INVENTION

1. Field of the Invention

This invention relates to circuits and methods for detection of the magnitude of input analog voltage signals and the conversion of the detected magnitude to a digital code. More particularly, this invention relates to multiple stage analog-to-digital converters where a first conversion determines a coarse range of the input analog voltage signal and subsequent conversions resolve the determination of input analog voltage signal to finer increments.

2. Description of Related Art

Analog-to-digital (A/D) converters are well known in the art for the conversion of continuously variable electronic signals to digital codes representing the magnitude of the electronic signals. Two types of A/D converters include the Successive Approximation type A/D converter and the FLASH type A/D converter. The Successive Approximation type A/D converter functions by creating a trial digital code and converting the trial digital code to a trial analog signal, the trial analog signal is compared to the input signal and an error signal is generated. A new digital code is created. The digital new code is converted to a new trial analog signal. The new trial analog signal is compared to the input signal and a new error signal is created. Then a new digital code is created. This process is successively repeated until the error signal approaches a zero level and the correct digital code has been generated to represent the input signal.

Figure 1:
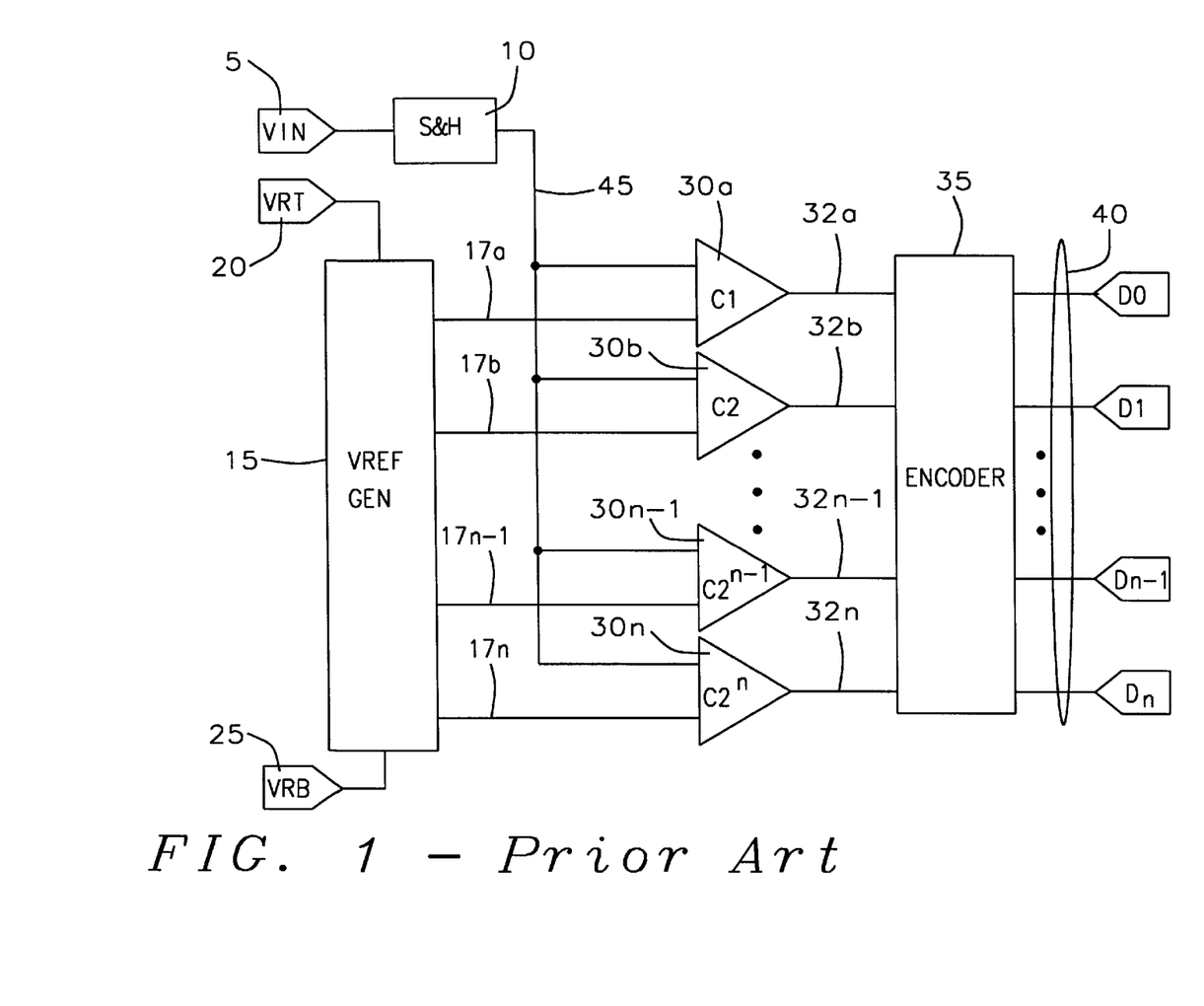
FIG. 1 is a schematic block diagram of a FLASH A/D converter of the prior art.

The FLASH A/D converter, as shown in FIG. 1, has a sample and hold circuit 10 to capture and retain the analog input signal VIN 5. The sampled and held analog input signal 45 is the input to multiple voltage comparators 30a, 30b, ..., 30n-1, 30n. The number of voltage comparators 30a, 30b, 30n-1, 30n is determined as:

$$N_c = 2^n$$

where:
Nc is the number of voltage comparators 30a, 30b, ..., 30n-1, 30n, and
N is the number of binary digits of the digital code D0, D1, ..., DN-2, DN-1, 40.

Further, each voltage comparator has a voltage reference 17a, 17b, ..., 17n-1, 17n. The voltage references 17a, 17b, ..., 17n-1, 17n are generated in the voltage reference generator 15. The voltage reference generator 15 is classically a resistive voltage divider connected between the top reference voltage VRT 20 and the bottom reference voltage VRB 25. Each of the voltage references 17a, 17b, ..., 17n-1, 17n are spaced incrementally between the top reference voltage VRT 20 and the bottom reference voltage VRB 25.

The outputs 32a, 32b, ..., 32n-1, 32n of the voltage comparators 30a, 30b, ..., 30n-1, 30n form a thermometer code. The thermometer code has a first logic level such as a "1" for those comparators 30a, 30b, ..., 30n-1, 30n where the voltage references 17a, 17b, ..., 17n-1, 17n are less than the amplitude of the sampled and held analog input signal 45 and a second logic level such as a "0" for those comparators where the voltage references 17a, 17b, ..., 17n-1, 17n are greater than the sampled and held analog input signal 45.

The outputs 32a, 32b, 32n-1, 32n of the comparators 30a, 30b, ..., 30n-1, 30n are the inputs to the encoder 35. The encoder 35 creates the digital code D0, D1, ..., Dn-1, Dn 40.

The structure of the FLASH A/D converter becomes very large and cumbersome as the number of binary digits of the digital code D0, D1, ..., Dn-1, Dn 40 increases. For instance, if the digital code D0, D1, ..., Dn-1, Dn 40 had eight binary digits, then there would be 2 or 256 comparator 30a, 30b, ..., 30n-1, 30n and 256 voltage references 17a, 17b, ..., 17n-1, 17n from the reference generator 15. However, if the digital code D0, D1, ..., Dn-2, Dn-1 40 has twelve binary digits, there are $2^{12}$ or 4096 comparators 30a, 30b, ..., 30n-1, 30n and 4096 voltage references 17a, 17b, ..., 17n-1, 17n from the voltage reference generator 15. Thus, an increase in precision of the conversion, cause a significantly more complex designs.

Figure 2:
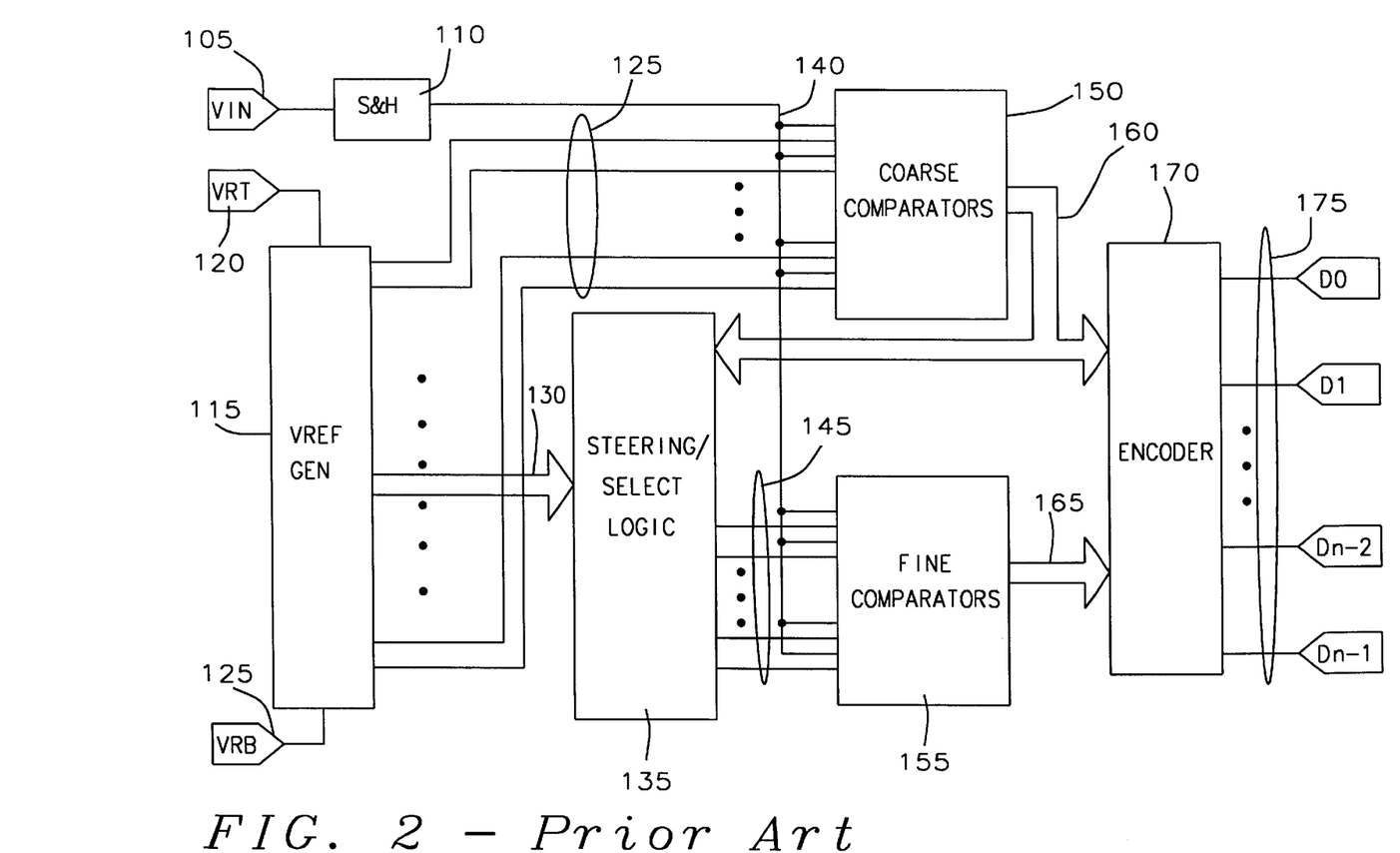
FIG. 2 is a schematic block diagram of a multi staged FLASH A/D converter of the prior art.

To alleviate this complexity, multiple stage A/D converters have been disclosed in U.S. Pat. No. 4,903,028 (Fukushima), U.S. Patent 5,291,198 (Dingwall et al.), and U.S. Pat. No. 5,726,653 (Hsu et al.), and are shown in FIG. 2. The analog input signal VIN 105 is the input to the sample and hold circuit 110. The sample and hold circuit 110 periodically samples and retains the analog VIN 105 to create the sampled and held analog input signal 140.

The sampled and held analog input signal 140 is the input to a set of coarse voltage comparators 160. The coarse voltage comparators 150 compare the sampled and held analog input signal 140 to a set of coarse reference voltages 125. The results of the comparison of the sampled and held analog input signal 140 and the set of coarse reference voltages 125 is a set of coarse thermometer codes 160 indicating the amplitude of the sampled and held analog input signal 140 relative to the each of the set of coarse reference voltages.

The set of coarse thermometer codes 160 has the first logic level (1) at those comparators of the set of coarse comparators 150 that have a coarse reference voltage from the set of coarse reference voltages 125 that is less than the amplitude of the sampled and held analog input signal 140, and have the second logic level (0) for those comparators of the set of coarse comparators 150 that have a coarse reference voltage from the set of coarse reference voltages 125 that is greater than the amplitude of the sampled and held analog input signal 140.

The coarse reference voltages 125 are generated by the voltage reference generator 115. The voltage reference generator is connected between the top reference voltage source VRT 120 and the bottom reference voltage source VRB 115. Each coarse reference voltage of the set of coarse reference voltages 125 is distributed incrementally between the top reference voltage source VRT 120 and the bottom reference voltage source 125. The coarse voltage increment between each coarse reference voltage is determined as:

$$\Delta V_{MSB} = \frac{VRT - VRB}{2^{n_{MSB}}}$$

where:
$\Delta V_{MSB}$ is the increment between each coarse reference voltage,
$n_{MSB}$ is the number of Most Significant Bits (MSB) of the digital code D0, D1, ..., Dn-2, Dn-1 175.

A sub-set of fine reference voltages are placed between each of the coarse reference voltages. The fine voltage increment between each fine reference voltage is:

$$\Delta V_{LSB} = \frac{\Delta V_{MSB}}{2^{n_{LSB}}}$$

where:

$\Delta V_{LSB}$ is the increment between each coarse reference voltage, $n_{LSB}$ is the number of Most Significant Bits (MSB) of the digital code D0, D1, . . . , Dn–2, Dn–1 175.

All of the subsets of the fine reference voltages 130 are transferred to the steering/select logic 135. The steering/select logic 135 decodes the coarse thermometer code 160 to determine the two coarse voltage references that the sampled and held analog input voltage 140 lies between. That subset of the fine reference voltages between two coarse voltage references forms the one set of fine reference voltages connected to the fine comparators 155.

The sampled and held analog input signal 140 is connected to the fine comparators and is compared to each of the fine reference voltages of the set of fine reference voltages 145. The results of comparison of sampled and held analog input signal 140 with each of the fine reference voltages 145 are the set of fine thermometer codes 165.

The set of fine thermometer codes 165 has a first logic level (1) at those comparators of the set of fine comparators 155 that have a fine reference voltage of the set of fine reference voltages 145 that is less than or equal to the amplitude of the sampled and held analog input signal 140, and has the second logic level (0) for those comparators of the set of fine comparators 155 that have a fine reference voltage of the set of fine reference voltages 145 that is greater than the amplitude of the sampled and held analog input signal 140.

The coarse thermometer codes 160 and the fine thermometer codes 165 are transformed in the encoder 170 to the digital code D0, D1, . . . , Dn–2, Dn–1 175.

The digital code D0, D1, . . . , Dn–2, Dn–1 175 is composed of the Least Significant Bits (LSB) and the Most Significant Bits (MSB) appended together. The number of coarse converters is determined as:

$$N_{CC} = 2^{n_{MSB}}$$

where:

$N_{cc}$ is the number of coarse converter, and $n_{MSB}$ is the number of Most Significant Bits.

The number of fine converters is determined as:

$$N_{FC} = 2^{n_{LSB}}$$

where:

$N_{FC}$ is the number of fine converters, and $n_{MSB}$ is the number of Least Significant Bits.

If the number of bits in the digital code D0, D1, . . . , Dn–2, Dn–1 175 is twelve as above described, but the number of Most Significant Bits and the number of Least Significant Bits is six each, then the number of comparators (Nc) is now.

$$N_c = N_{cc} + NFC$$
$$N_c = 2^6 + 2^6 = 128.$$

The FLASH A/D converter described in FIG. 1 would have had 4096 comparators while the comparator of FIG. 2 has 128 comparators. This is a significant reduction in complexity with only the addition of the steering/select logic 135.

The voltage reference generators 115 still has 4096 voltage taps and with the addition of the connections for the steering/select logic 135 has additional complexity.

The coarse comparators 150 and the fine comparators 155 are generally implemented as differential amplifiers. The differential amplifier is well known in the art. The reference voltage is usually connected to the noninverting input terminal while the analog input voltage is connected to the inverting input terminal. The output terminal has the first logic level (1) for any voltage less than the reference voltage and has the second logic level (0) for any voltage greater than the reference voltage.

U.S. Pat. No. 5,355,135 (Redfern) describes a semi-flash A/D converter using a reduced number of comparators and a voltage comparator which can be used in a semi-flash mode of operation to obtain both the Most Significant Bits and the Least Significant Bits for a digital conversion. A feature of Redfern is a 6 input switched capacitor comparator for use in accomplishing a semi-flash conversion of an analog signal to a digital signal. A Most Significant Bit and a Least Significant Bit are sequentially obtained using a single comparator comprising a 6-input switched capacitor operational amplifier. Three inputs are switchably and capacitively coupled to the amplifier input through a first capacitor, and three inputs are switchably and capacitively coupled to the amplifier input through a second capacitor. The input terminal of the amplifier acts as a virtual ground in which charges simultaneously coupled thereto are summed, and charges subsequently applied are subtracted. The capacitors function as a sample-and-hold network is retaining the input signal for both the Most Significant Bit and Least Significant Bit comparisons.

U.S. Pat. No. 4,507,649 (Dingwall et al.) teaches a FLASH A/D converter that limits the amount of charge that can be displaced on any given summing capacitor via the signal input bus and by isolating each of the signal input switches from the signal input bus by respective serial impedances. A field effect transistor (FET) is connected between each signal input switch and the signal input bus. The gate electrodes of the FET's are biased at DC potentials, which are tailored to the relative position of the respective FET's along the resistive ladder. The FET's are constrained to operate in the source follower mode for certain ranges of the input signal so that the individual summing capacitors cannot charge or discharge to a potential exceeding the respective FET gate potential minus the threshold potential of the transistor. This reduces loading on the resistive ladder. The drain-source impedance of the respective FET's shields the signal input bus from clock feed-through attendant the signal input switches.

U.S. Pat. No. 4,922,252 (Draxelmayr et al.) discloses an A/D converter operating on the principle of charge distribution. The A/D converter includes a capacitor network having dual-weighted capacitors including two smallest capacitors. The capacitors each have two terminals. A comparator has a first input connected to one of the terminals of each of the capacitors and a second input and a reference switch is connected between each of the one terminals and a first reference potential. Other switches each selectively connect the other of the terminals of a respective one of the capacitors to an input analog potential, the first reference potential and a second reference potential. A coupling capacitor is connected upstream of the first input of the comparator.

U.S. Pat. No. 4,639,715 (Doluca) describes an improved A/D converter in which the polarity of the input range is selectable independent of the polarities of the reference inputs. The A/D converter circuit uses the same flash converter circuit to generate both the high order and low order bits of the digital output code. After the flash converter circuit generates the high order bits, an equivalent analog voltage of the high order bits is subtracted from the analog input signal to produce a residual signal. This residual signal is multiplied by a factor corresponding to the number of bit positions of the high order bits to produce a product signal. The product signal is reapplied to the flash converter circuit, which then generates the low order bits. Because the same flash converter circuit is used to generate both the high and low order bits, a significant reduction in the size of an analog to digital converter circuit can be achieved. Another aspect of Doluca is that the polarities of the full scale input and the low scale input are programmable to be the same as or the opposite of the reference inputs. In the illustrated embodiment, the converter circuit includes a switched input comparator array in which the order in which a reference signal and an input signal are inputted by the array is a function of the polarity of one of the reference inputs, and the correspondence between the reference input polarity and the desired input range polarity. This changes the input order of the input signal and the reference signal allow the polarity of the full scale analog input signal (and the low scale input signal) to be set independently of the polarity of the reference inputs. Consequently, the converter circuit does not require particular reference input polarities in order to achieve the desired input range polarities.

U.S. Pat. No. 4,523,107 (Peterson) discloses a switched capacitor comparator. The intent of Peterson is to provide a switched capacitor comparator having improved noise rejection and reduced offset voltage.

Further, the switched capacitor comparator of Peterson has accurate gain and improved stability over temperature with higher speed and resolution. The switched capacitor comparator of Peterson is comprised of a plurality of capacitively coupled amplifier or gain stages. Some or all of the amplifiers or gain stages have differential inputs coupled to a reference voltage. Each gain stage has a switch coupled between its output and its input to provide feedback. The switches are sequentially switched to reduce offset. Further, some or all of the switches have feedback capacitors placed in parallel with the switches to provide accurate gain and stability.

SUMMARY OF THE INVENTION

An object of this invention is to provide an A/D converter having multiple stages of conversion. The first stage of the conversion determines the Most Significant Bits of the output digital code and a second stage of conversion determines the Least Significant Bits of the output digital code.

Another object of this invention is to provide a multiple voltage reference comparator for use in an A/D converter that allows one set of voltage comparators to be used in creating coarse and fine thermometer codes that respectively determine the Most Significant Bits and the Least Significant Bits of the digital code.

Further, another object of this invention is to provide a set of error detection voltage comparators to determine errors in the coarse thermometer code and allow correction during encoding of the Most Significant Bits.

To accomplish these and other objects an A/D converter of this invention has a sample and hold circuit to receive, sample and hold said input voltage signal. A reference voltage generator is connected between a first reference voltage source and a second reference voltage source. The reference voltage generator has a plurality of coarse output taps and a plurality of fine output taps situated between the first reference voltage source and a first coarse output tap.

The A/D converter of this invention further has a plurality of coarse/fine comparators to compare the voltages of the reference voltage generator to the input voltage signal. A switch timing control circuit is connected to a switch timing control input of each of the plurality of coarse/fine comparators to create the timing control signal necessary to create the first and second output signals of each of the plurality of coarse/fine comparators. An encoder circuit is connected to all the compare outputs of the plurality of coarse/fine comparators to receive the coarse and fine output signals of all the plurality of coarse/fine comparators. The encoder then encodes all the coarse and fine output signals to determine said digital output code and then place said digital output code at a plurality of output terminals for transmission to subsequent circuitry.

The coarse/fine comparator includes a first input connected to sample and hold circuit to receive the sampled and held input voltage signal, a second input connected to first reference voltage source, a third input connected one of the fine output taps of the reference voltage generator, a fourth input connected one of the plurality of coarse output taps, a fifth input connected to a second coarse output tap adjacent to the one coarse output tap, a switch timing control input to provide a timing control signals to said coarse/fine comparator, and a compare output to provide a coarse output signal indicating that the voltage level of the sampled and held input voltage signal is greater than the one coarse output voltage tap, and a fine output signal indicating that the voltage level of the sampled and held in voltage signal is greater than the sum of the one coarse output voltage tap and the fine output voltage tap.

The coarse/fine comparator further includes a first capacitor having a first capacitor plate connected to the second input. A first switch has a first contact terminal connected to the second capacitor plate of the first capacitor, a second contact terminal connected to the first input, and a control input connected to the switch timing control input to selectively connect the sampled and held input voltage signal to the second plate of the first capacitor. The coarse/fine comparator further, has a second capacitor. The second capacitor has a first capacitor plate and a second capacitor plate. A second switch has a first contact terminal connected to the first input, a second contact terminal connected to the second plate of the second capacitor, and a control input connected to the switch timing control input to selectively connect the sampled and held input voltage signal to the second plate of the first capacitor. A third switch has a first contact terminal connected to the second input, a second contact terminal connected to the second plate of the second capacitor, and a control input connected to the switch timing control input to selectively connect the first reference voltage source to the first plate of the second capacitor. A fourth switch having a first contact terminal connected to the first plate of the second capacitor, a second contact terminal connected to the third input terminal, and a control input connected to the switch timing control input to selectively connect the first plate of the second capacitor to the one fine output tap. The coarse/fine comparator has a third capacitor with a first capacitor plate and a second capacitor plate and an amplifier circuit. The amplifier circuit includes an input terminal and an output terminal, whereby an amplifier output signal at the output terminal has a voltage level equal to a gain factor multiplied by an amplifier input signal at the input terminal.

The coarse/fine comparator has a fifth switch. The fifth switch has a first contact terminal connected to the second capacitor plate of the second capacitor, a second contact terminal connected to the first capacitor plate of the third capacitor, and a control input connected to the switch timing control input connected to the switch timing control input to selectively connect the second capacitor to the first capacitor plate of the third capacitor. A sixth switch having a first contact terminal connected to the second capacitor plate of the first capacitor, a second contact terminal connected to first capacitor plate of the third capacitor, and a control input connected to the switch timing control input to selectively connect the second capacitor plate of the first capacitor to the first capacitor plate of the third capacitor. A seventh switch having a first contact terminal connected to the first plate of the third transistor, a second contact terminal connected to the fourth input, and a control input connected to the switch timing control input to selectively connect the first capacitor plate of the third capacitor plate to the one coarse output tap of the plurality of coarse output taps. An eighth switch has a first contact terminal connected to the first plate of the third capacitor, a second contact terminal connected to the fifth terminal, and a control input connected to the switch timing control input to selectively connect the first capacitor plate of the third capacitor to the second coarse output tap. And a ninth switch has a first contact terminal connected to the input terminal of the amplifier, a second contact terminal connected to the output terminal of the amplifier, and a control input connected to the switch timing control input to selectively connect the output terminal of the amplifier to the input terminal of the amplifier to establish a threshold biasing voltage at said input terminal.

The switch timing circuit creates a first activation signal at a first time. The first activation signal activates the first, second, third and seventh switches to provide a coarse sampling of the sampled and held input voltage signal, and activates the ninth switch to establish the threshold biasing voltage at the input terminal of the amplifier. A second activation signal is created at a second time to deactivate the first, second, third, seventh and ninth switches, to activate the fourth switch to initialize a fine reference voltage, and to activate the sixth switch to create the coarse output signal. A third activation signal is created at a third time to activate the eighth switch to a coarse differential voltage, and to activate the ninth switch to establish the threshold biasing voltage at the input terminal of the amplifier. A fourth activation signal is created at a fourth time to deactivate the eighth and ninth switches, to activate the fifth switch to create the fine output signal.

The A/D converter, further, has a plurality of error determining coarse/fine comparators. A first portion of the error determining coarse/fine comparators is appended to a first side of the plurality of coarse/fine comparators and a second portion of the error determining coarse/fine comparators is appended to a second side of the plurality of coarse/fine comparators. The plurality of error determining coarse/fine comparators creates an error signal indicating an error in the coarse output signal and indicating a corrective factor to be employed by the encoder to create a correct digital output code.

DETAILED DESCRIPTION OF THE INVENTION

Figure 3:
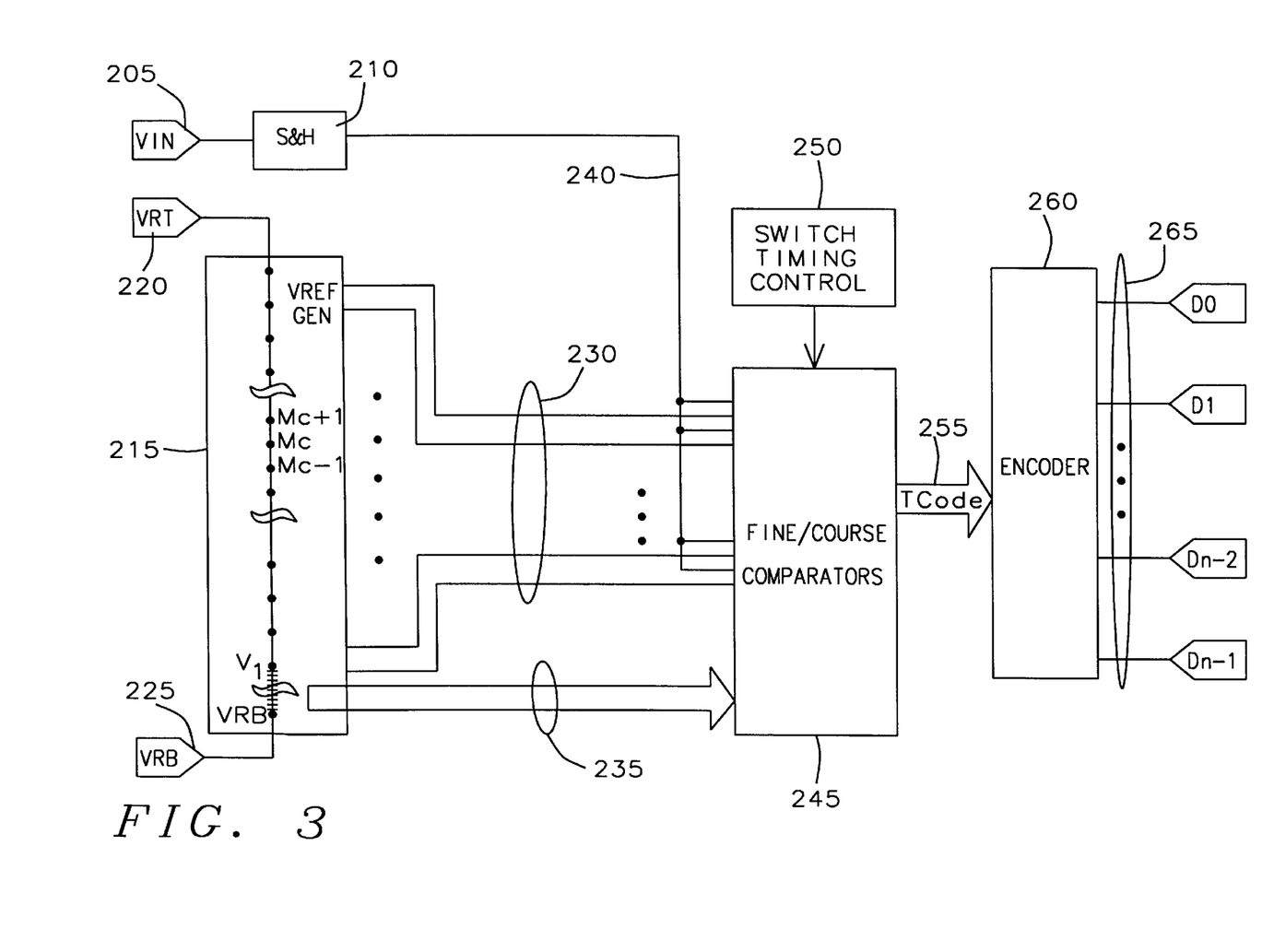
FIG. 3 is a schematic block diagram of an A/D converter having multiple reference voltage comparators of this invention.

The A/D converter employing a multiple reference voltage comparator is shown in FIG. 3. An analog input voltage 205 is sampled and held in the sample and hold circuit 210 to form the sampled and held analog input signal 240. The sampled and held analog input signal 240 is the input to the fine/coarse comparators 245. The fine/coarse comparators 245 are composed of plural multiple reference voltage comparators. The voltage reference generator 215 generates a set of coarse voltage references 230 and a set of fine voltage references 235 that are inputs to the fine/coarse comparators 245.

The coarse reference voltages 230 are distributed incrementally and uniformly between the top reference voltage source VRT 220 and the bottom reference voltage source vrb 225. The fine reference voltages 235 are distributed incrementally and uniformly between the bottom reference voltage source vrb 225 and the first coarse increment V of the coarse reference voltages 230.

The switch timing control circuit 250 is connected to fine/coarse comparators to control connections of the sampled and held analog input signal 240, the coarse reference voltages 230, an fine reference voltages 235 to the fine/coarse comparators 245 necessary to create the thermometer codes 255. The thermometer codes 255 sequentially contain the coarse thermometer codes at a first time and the fine thermometer codes at a second time. The creation of the thermometer codes 255 are further explained hereinafter.

The thermometer codes 255 are transformed in the encoder 260 to form the digital code D0, D1, . . . , Dn−2, Dn−1 265.

Figure 4:
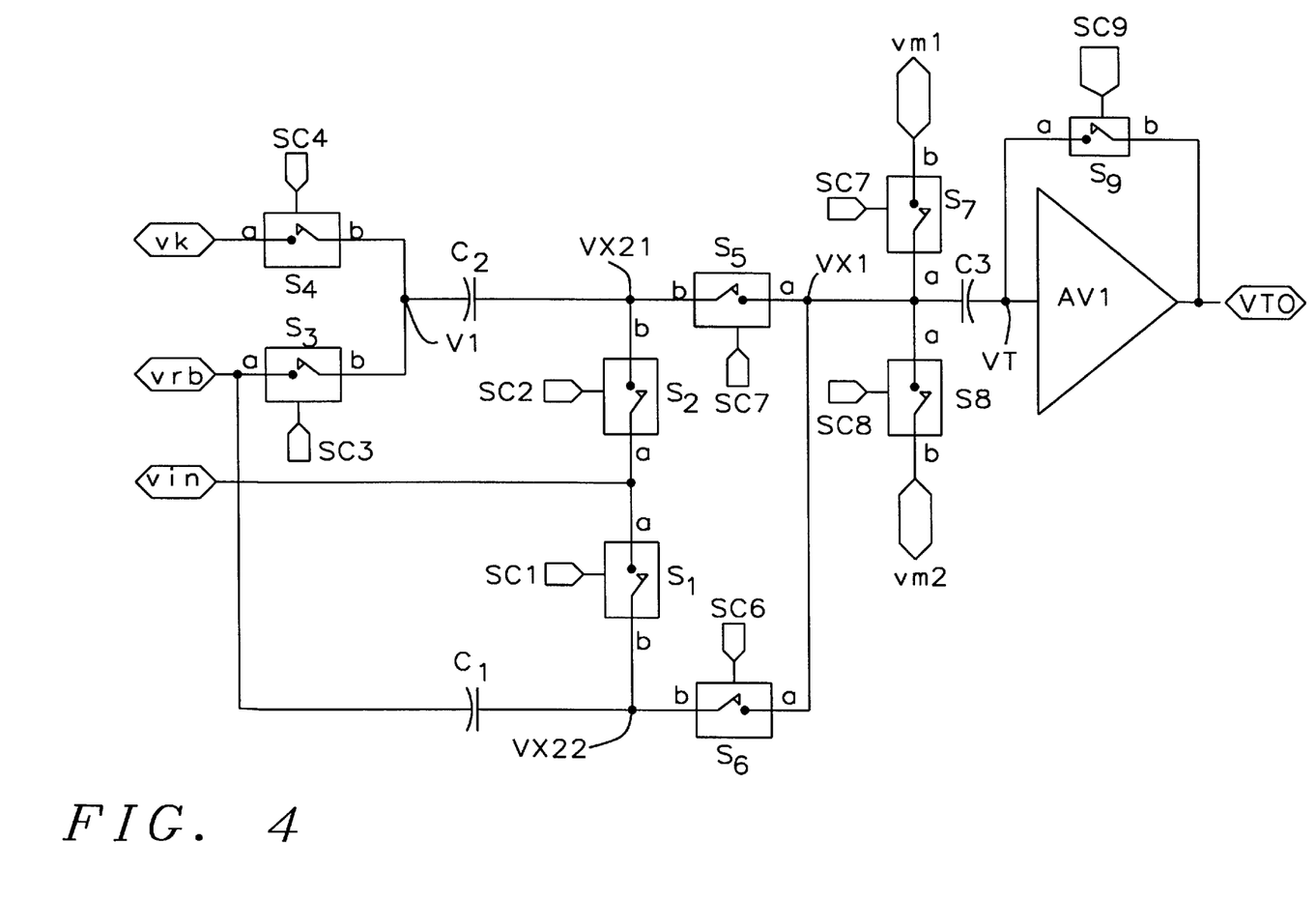
FIG. 4 is a schematic diagram of a multiple reference voltage comparator of this invention.

Refer now to FIG. 4 for an explanation of a multiple reference voltage comparator that forms the fine/coarse comparators 245 of FIG. 3.

The sampled and held analog input signal 140 of FIG. 3 is connected to the first input vin. The first input is connected to contacts a of the switches $S_1$ and $S_2$. The bottom reference voltage source vrb 225 of FIG. 3 is connected to a second input vrb. The second input is connected to the contact a of switch $S_3$ and the bottom plate of the capacitor C. One of the fine reference voltages 235 of FIG. 3 is connected to a fourth input vrk. The fourth input vrk is connected to the contact a of the switch $S_4$.

The top plate of the capacitor $C_1$ is connected to the contacts b of the switches $S_1$ and $S_6$. This connection forms the node VX22. The contacts b of the switches $S_3$ and $S_4$ are connected to the bottom plate of the capacitor $C_2$. This connection forms the node V1.

The contacts b of the switches S2 and S5 are connected to the top plate of the capacitor C2. This connection forms the node VX21.

The contacts a of the switches S5, S6, S7, and S8 are connected to the top plate of the capacitor C3. This connection forms the node VX1. The contact b of the switch S7 is connected to the fourth input vm1. The fourth input vm1 is connected to one of the coarse reference voltages 230 of FIG. 3. The contact b of the switch S8 is connected to a fifth input vm2. The fifth input vm2 is connected to one of the coarse reference voltage 230 of FIG. 3 that is adjacent to the coarse reference voltage connected to the fourth input vm1.

The bottom plate of the capacitor C3 is connected to the input of the amplifier and this connection forms the node VT the contact a of the switch S9. The output of the amplifier Av1 is connected to the output terminal VTO and the contact b of the switch S9. The output terminal VTO is connected to subsequent circuitry such as the encoder 260 of FIG. 3.

Each switch, S1, S2, S3, S4, S5, S6, S7, S8, S9, has a control terminal SC1, SC2, SC3, SC4, SC5, SC6, SC7, SC8, and SC9, that is connected to the switch timing control circuitry 250 of FIG. 3. The switch timing control circuitry provides a sequence of signals to selectively and appropriately activate the switches S1, S2, S3, S4, S5, S6, S7, S8, S9, to first compare the signal at the first input VIN with the reference voltage level at the fourth input vm1 and then subsequently to compare the signal at the first input to the reference voltage level formed by a combination of the second, third, and fifth inputs vrb, vk, vm2.

Figure 5:
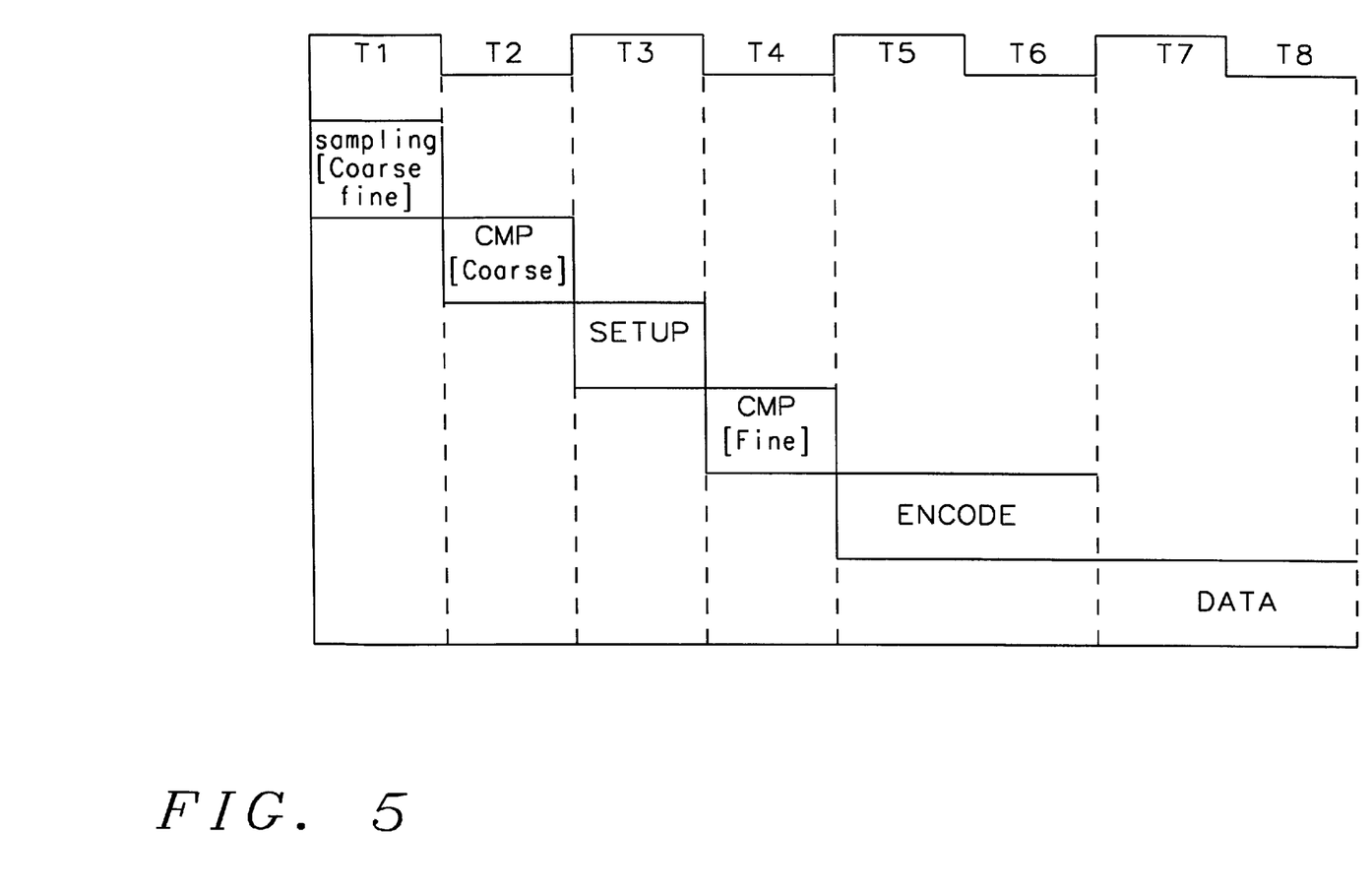
FIG. 5 is a timing diagram of the operation of the A/D converter of this invention.

For a complete explanation of the operation of the multiple reference voltage comparator and the A/D converter of this invention refer now additionally to FIG. 5. At time T1 the signal at the first input is sampled for both of the comparisons to be performed. In the case of the A/D converter of this invention the first comparison is to establish each digit of the coarse thermometer code and the second comparison is to establish each digit of the fine thermometer codes.

To perform the sampling, switches S1 and S2 are closed such that the input signal is placed at the top plates of the capacitor C1 and C2. The switch S3 is closed to place the bottom reference voltage source vrb 225 of FIG. 3 at the bottom plate of the capacitor C2. The switch S7 is closed to place one of the coarse reference voltages 230 of FIG. 3 at the top plate of the capacitor C5. The switch S9 is closed to connect the output of the amplifier Av-1 to its input, thus forcing the input node VT and the bottom plate of the capacitor C3 to approximately the threshold voltage Vth of the amplifier AV1. The remaining switches S4, S5, S6, and S8 remains deactivated.

At time T2 the coarse comparison is executed. The switches S1, S2, S3, S7, and S9 are deactivated and the switches S5 and S8 remain deactivated. The switch S6 is activated to transfer the voltage at the node VX22 to the node VX1. The voltage at the node VX22 is the input signal at the first input vin. The voltage level of the input signal can be described by the formula:

$$vin = M*\Delta MSB + N*\Delta LSB + vrb$$

where:
$\Delta MSB$ is the coarse voltage increment determined by the Most Significant Bits of digital code D0, D1, ..., Dn-2, Dn-1 265 of FIG. 3,
$\Delta LSB$ is the fine voltage increment determined by the Least Significant Bits of the digital code D0, D1, ..., Dn-2, Dn-1 265 of FIG. 3,
M is the number of coarse voltage increments,
N is the number of fine voltage increments, and
vrb is the voltage level of the bottom reference voltage source vrb 225 of FIG. 3.

The voltage vm1 present at the node VX1 before activation of the switch S6 can be written as:

$$vm1 = Mc*\Delta MSB$$

where:
Mc is the one coarse reference voltage of the set of coarse reference voltages 230 of FIG. 3 attached to the fourth input vm1, and
$\Delta MSB$ is the coarse voltage increment.

Thus after the switch S6 has been activated and the switches S7 and S9 deactivated, the voltage at the node VT becomes:

$$VT = VTH + vin - vm1$$

$$VT = VTH + (M-Mc)*\Delta MSB + N*LSB.$$

The voltage at the output terminal VTO then becomes:

$$VTO = VTH + Av((M-Mc)*\Delta MSB + N*LSB)$$

where:
Av is the gain of the amplifier Av1.

The gain Av of the amplifier Av-1 is sufficiently large that the output terminal VTO has a voltage that has a first logic state (1) for a voltage level at the first input terminal vin less than the coarse reference voltage at the fourth input terminal vm1 and a second logic state (0) for a voltage level at the first input vin greater than the coarse reference voltage at the fourth input terminal vm1.

The switch S4 is activated to place the fine voltage reference at the third input terminal vk at the bottom plate of the capacitor C2. The fine reference voltage vk can be considered as:

$$vk = vrb + K*\Delta LSB$$

where:
vk is the fine reference voltage,
vrb is the voltage of bottom reference voltage vrb 225 of FIG. 3
$\Delta LSB$ is the fine voltage increment of the fine voltage references 235 of FIG. 3,
K is the number of the fine voltage increments being compared.

Thus the voltage level at the node VX21 becomes:

$$Vx21 = vin + (vk - vrb).$$

At time T3, the multiple reference voltage comparator is prepared or set up for the fine voltage comparison. The switches S1, S2, S3, S5, S6, and S7, remain deactivated and the switch S4 remain activated. The switch S8 is activated to place, at the fifth input, the coarse reference voltage that is adjacent to and one increment $\Delta MSB$ greater than the coarse reference voltage at the fourth input at the fifth input vm1 at the fifth input. This makes the voltage at the node VX1 becomes:

$$Vx1 = (Mc+1)\Delta MSB + vrb.$$

The switch S9 is closed to connect the output of the amplifier Av-1 to its input and thus forcing the node VT to the threshold voltage VTH of the amplifier Av1.

The fine voltage comparison is accomplished at the time T4. The switches S1, S2, S3, S6, and S7, remain deactivated.

The switches S8 and S5 are deactivated and the switch S4 remains activated. The switch S5 activates to couple the voltage at the node VX21 to the top plate of the capacitor C3. The voltage at the node VX1 becomes $$Vx1=vin+(vk-vrb).$$

In addition, the voltage at the input VT of amplifier Av1 becomes:

$$VT=VTH+vin+vk-vrb-vm2$$

$$VT=VTH+vrb+M*\Delta MSB+N*\Delta LSB+vrb-vrb-(M+1)*\Delta MSB-vrb$$

$$VT=VTH+((N+K)\Delta LSB-\Delta MSB).$$

The output at the output terminal VTO is:

$$VTO=VTH+Av((N+K)\Delta LSB-\Delta MSB)$$

Again, the gain Av of the amplifier Av1 is sufficiently large that the output terminal VTO is a voltage that is the first logic state (1) for a voltage level at the first input terminal vin is:

$$vin<Mc*\Delta MSB+K*\Delta LSB.$$

In addition, is the second logic state for a voltage level at the first input terminal vin is:.

$$vin>Mc*\Delta MSB+K*\Delta LSB.$$

The coarse thermometer codes and the fine thermometer codes transformed during times T5 and T6 in the encoder 260 of FIG. 3 to form the digital code D0, D1, . . . , Dn−2, Dn−1 265 of FIG. 3. The digital code D0, D1, . . . n−2, Dn−1 265 of FIG. 3 is transmitted to external circuitry at time T7 and T8.

As is apparent to those skilled in the art, the switches S1, S2, S3, S4, S5, S6, S7, S8, and S9 can be implemented as MOS transistors.

Figure 6:
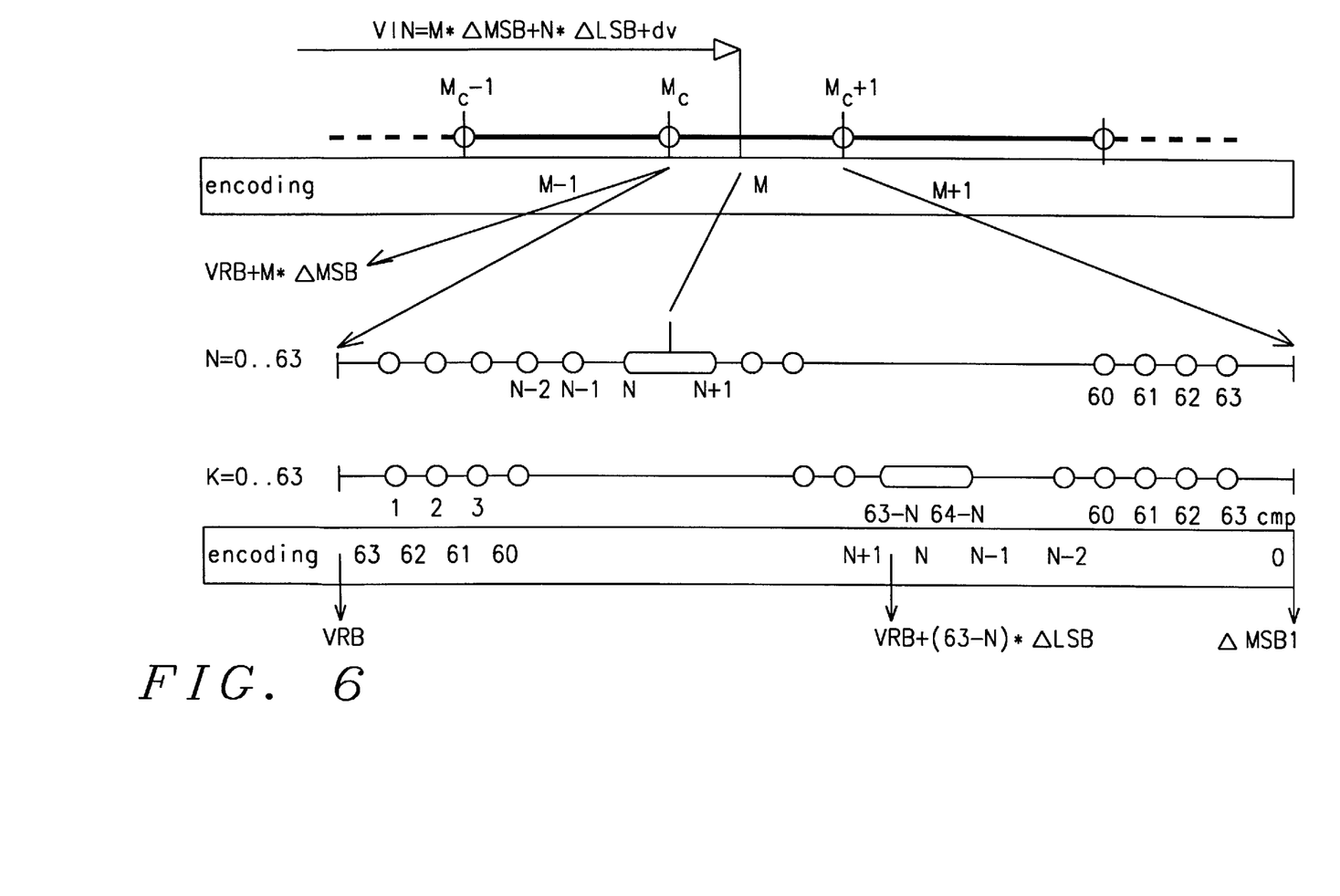
FIG. 6 is a diagram illustrating the determination of the coarse and fine thermometer codes within the A/D converter of this invention.

Refer now to FIG. 6 to discuss the general method employed to convert the magnitude of an analog signal VIN to a digital code. The magnitude of the analog signal VIN can be represented as:

$$VIN=M*\Delta MSB+K*\Delta LSB+\delta v$$

where:
   ΔMSB is the coarse increment of a reference voltage against which the analog signal is compared,
   ΔLSB is the fine increment of a reference voltage against which the analog signal is compared,
   M is the actual number of coarse increments of the coarse reference voltage present in the analog signal,
   N is the actual number of fine increments of the fine reference voltage present in the analog signal, and
   δv is an error term indicating the error between the magnitude of the analog signal and the indicated magnitude of the digital code.

The method of creating the digital code that represents the magnitude of the analog signal begins by sampling and holding the analog signal. A plurality of coarse voltage references Mc−1, Mc, Mc+1 that is added to a common voltage reference VRB is provided. The coarse reference voltages Mc−1, Mc, Mc+1 and the common reference voltage source VRB are subtracted from the sampled and held analog signal. For those coarse reference Mc−1, Mc, Mc+1 voltages less than the sampled and held analog signal VIN, the results of the subtraction are positive and for those coarse reference voltages Mc−1, Mc, Mc+1 greater than the sampled and held analog signal VIN, the results of the subtraction are negative. The thermometer codes are created with the positive results being assigned a first logic level (1) and the negative results being assigned a second logic level (0).

A plurality of fine reference voltages K are added to the common reference voltage VRB is provided. The analog input signal VIN is added to the fine reference voltage K and the common reference signal VRB. The common reference signal VRB and the first coarse reference voltage that is greater than the sampled and held analog signal VIN is subtracted from the result of the addition.

The thermometer codes are now created as those fine voltage references from the first coarse voltage reference ΔMSB1 to the voltage level of the results of the above calculation N+1, N. N−1 is at the first logic level (1) and those fine voltage references K from the common reference voltage VRB to the voltage level of the results of the above calculation N+1, N, N−1 is at the second logic level (0).

The coarse thermometer codes and the fine thermometer codes are then transformed to the digital code.

During the coarse comparison the multiple reference voltage comparators that form the fine/coarse comparators 245 of FIG. 3 may derive an incorrect value for the coarse thermometer codes. This is especially true when the amplitude of the analog signal is very near the value of one of the coarse reference voltages and may oscillate as a result. To understand the technique to correct this problem refer now to FIG. 7. The set of fine/coarse comparators A(k) is as described in FIGS. 3 and 4. Additional sets of comparators Ec1, Ec2 are appended above and below the fine/coarse comparators A(k). During the resolution of the coarse thermometer codes, the coarse reference voltages are applied to the fine/coarse comparators A(k) as above described to determine which of the coarse reference voltages M−1, M, M+1 are greater or lessor than the voltage level of the analog input signal. During the determination if the voltage level of the analog input signal is a VIN1, the fine/coarse comparators A(k) should be situated between the coarse reference voltage M−1 and the coarse reference voltage M. However, if the voltage level of the analog input signal is at VIN2, the fine/coarse comparators A(k) should be situated between the coarse reference voltage M and the coarse reference voltage M+1.

Figure 7:
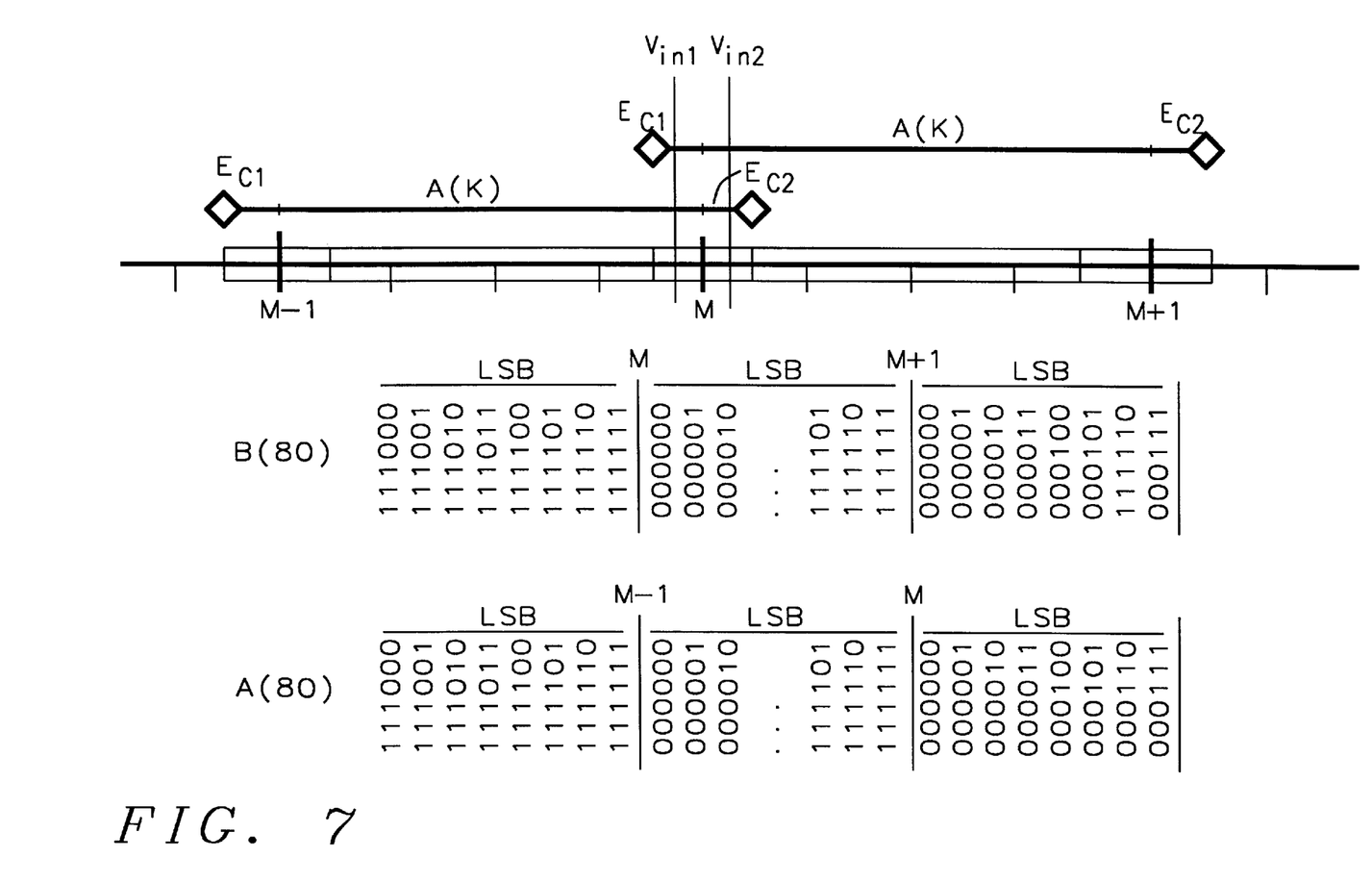
FIG. 7 is a diagram illustrating the operation of the error detection coarse/fine comparators to determine an error in the coarse thermometer code of the A/D converter of this invention.

If an error in detection had been made and the voltage level of the analog input was actually at VIN1, when the fine/coarse comparators A(k) were between the coarse reference voltage M and the coarse reference voltage M+1, or the voltage level of the analog input was actually at VIN2, when the fine/coarse comparators A(k) were between the coarse reference voltage M−1 and coarse reference voltage M, the thermometer codes would be incorrect. To alleviate this problem the additional error detection fine/coarse comparators Ec1 and Ec2 are activated. If the voltage level of the analog signal is at VIN1 and the fine/coarse comparators A(k) are between the coarse reference voltage M and the coarse reference voltage M+1, the error detection comparators Ec1 have an error detection thermometer code that extends beyond the boundary voltage M, thus indicating the magnitude of the error. Error correction functions within encoder 260 of FIG. 3 decrements the digital code of the Most Significant Bits to the code indicated by the coarse voltage reference M−1. The error detection thermometer code provides the Least Significant Bits of the digital code.

On the other hand, if the voltage level of the analog input was at VIN2 and the fine/coarse comparators A(k) were between the coarse reference voltages M−1 and the coarse reference voltages M, the error detection comparators Ec2 have an error detection thermometer code that extends beyond the boundary voltage M, thus indicating the magnitude of the error. The Error Correction function of the encoder 260 of FIG. 3 increments the digital code of the Most Significant Bits indicating the coarse reference voltage level M+1 to the digital code of the Most Significant Bits indicating the coarse reference voltage level M. The error detection thermometer codes, again, provides the necessary information for creating the Least Significant Bits of the digital code.

Figure 8:
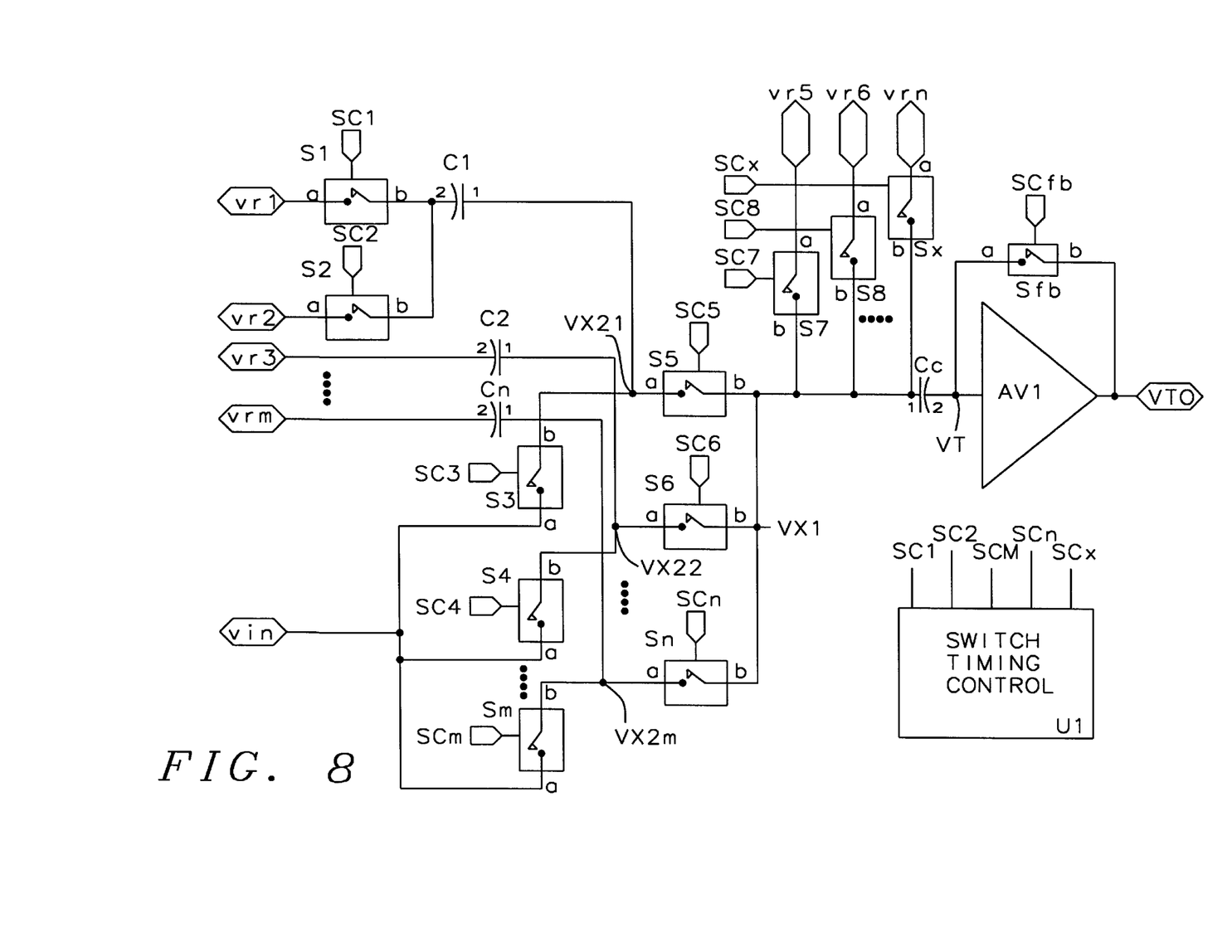
FIG. 8 is a schematic diagram illustrating a generalized form of a multiple reference, switched capacitor comparator of this invention

Refer now to FIG. 8 for a discussion of a generalized description of a multiple reference voltage switched capacitor comparator. The multiple reference voltage comparator as shown in FIG. 4 has multiple reference voltage sources which are arithmetically combined with the input voltage signal. The resulting voltage is then added to the threshold voltage of the amplifier to create the digital output signal.

The capacitors C1, C2, ..., Cn have their second plates (2) connected either directly to or through switches S1, S2 to the voltage reference sources vr1, vr2, vr3, ..., vrm. The switches S1 and S2 have their first contact terminals (a) connected respectively to the voltage references vr1 and vr2. The second contact (b) of switches S1 and S2 are connected to the capacitor C1.

The first contact terminals of the switches S3, S4, ..., Sm are connected to the input signal vin. The second contact terminals (b) of switches S3, S4, ..., Sm are respectively connected to the first plates (1) of the capacitors C1, C2, ..., Cn.

The switch control terminals SC1, SC2, S3, S4, ..., SCm are connected to the switch timing control circuit U1. The switch timing control circuit U1 creates appropriate timings such the voltages at the nodes VX21, VX22, ..., Vx2m are:

$$VX21 = vin + (vr1 - vr2),$$

$$VX22 = vin + vr3,$$

$$VX2m = vin + vrm.$$

The first contact terminals (a) of the switches S5, S6, ..., Sn are connected respectively to the nodes VX21, VX22, ..., VX2m. The second contact terminals (b) of the switches S5, S6, ..., Sn are connected to the node VX1. The first contact terminals (a) of the switches S7, S8, ..., Sx are connected respectively to the voltage reference sources vr5, vr6, ..., vrn. The second contact terminals (b) of the switches S7, S8, ..., Sx are connected to the node VX1. The first plate (1) of the coupling capacitor Cc is connected to the node VX1. The second plate (2) of the coupling capacitor Cc is connected to the amplifier input terminal of the amplifier Av1. The amplifier output terminal of the amplifier Av1 is connected to the output terminal VTO. The first contact terminal (a) of the feedback switch Sfb is connected to the node VT and the amplifier input terminal. The second contact terminal (b) of the feedback switch Sfb is connected to the amplifier output terminal.

The switch control terminals SC5, SC6, ..., SCn, ..., SC7, SC8, ..., SCx are connected to the switch timing control circuit U1. The switch timing control circuit U1 appropriately activates the feedback switch Sfb to bias the node VT to the threshold voltage Vt of the amplifier Av1. The feedback switch Sfb is deactivated and one of the switches S7, S8, or Sx are then activated to force the node VX1 to the voltage level of one of the reference voltage sources vr5, vr6, ..., vrn. The node VT then becomes:

$$VT = Vt - Vrn$$

The switches S7, S8, or Sx are deactivated. One of the switches S5, S6, or Sn are activated and the voltage present at one of the nodes VX21, VX22, ..., VX2m is transferred to the node VX1. The voltage at the node VT now becomes:

$$VT = Vt - (vm + VX2n)$$

If the node VT becomes greater than the threshold voltage Vt of the amplifier Av1, the output terminal VTO becomes the first logic level (0). If the node VT becomes less than the threshold voltage Vt of amplifier Av1, the output terminal VTO becomes the second logic level (1). Thus it can be seen that the input voltage can be compared with an arithmetic combination of any or all of the reference voltage sources vr1, vr2, ..., vrm, ..., vr5, vr6, ..., vrn.

While this invention has been particularly shown and described with reference to the preferred embodiments thereof, it will be understood by those skilled in the art that various changes in form and details may be made without departing from the spirit and scope of the invention. An illustration of such changes would be the inclusion of multiple sets of the fine/coarse comparators 245 of FIG. 3 in the A/D converter of this invention. Multiple sets of the fine/coarse comparators 245 of FIG. 3 would provide interleaved samplings of the analog input signal VIN 205 of FIG. 3 to enable the A/D converter of this invention to create the digital codes D0, D1, ..., Dn−2, Dn−1 265 of FIG. 3 more frequently per unit time.

The invention claimed is:

1. An analog-to-digital converter that senses an input voltage signal determine a voltage level of said input voltage signal, and convert said voltage level to a digital output code indicating said voltage level, comprising:

a sample and hold circuit to receive, sample and hold said input voltage signal;

a reference voltage generator connected between a first reference voltage source and a second reference voltage source and having a plurality of coarse output taps and a plurality of fine output taps situated between the first reference voltage source and a first coarse output tap;

a plurality of coarse/fine comparators, whereby each coarse/fine comparator includes a first input connected to sample and hold circuit to receive the sampled and held input voltage signal, a second input connected to first reference voltage source, a third input connected one of the fine output taps of the reference voltage generator, a fourth input connected one of the plurality of coarse output taps, a fifth input connected to a second coarse output tap adjacent to the one coarse output tap, a switch timing control input to provide a timing control signals to said coarse/fine comparator, and a compare output to provide a coarse output signal indicating that the voltage level of the sampled and held input voltage signal is greater than the one coarse output voltage tap, and a fine output signal indicating that the voltage level of the sampled and held in voltage signal is greater than the sum of the one coarse output voltage tap and the fine output voltage tap;

a switch timing control circuit connected to the switch timing control input of each of the plurality of coarse/fine comparators to create the timing control signal necessary to create the first and second output signals of each of the plurality of coarse/fine comparators; and an encoder circuit connected to all the compare outputs of the plurality of coarse/fine comparators to receive the coarse and fine output signals of all the plurality of coarse/fine comparators, encode all the coarse and fine output signals to determine said digital output code, and to place said digital output code at a plurality of output terminals for transmission to subsequent circuitry.

2. The analog-to-digital converter of claim 1 wherein the plurality of coarse output taps are distributed symmetrically between the first reference voltage generator and the second voltage generator.

3. The analog-to-digital converter of claim 1 wherein the plurality of fine output taps are distributed symmetrically the first reference voltage source and the first coarse output tap.

4. The analog-to digital converter of claim 1 wherein a number of the plurality of coarse/fine comparators is determined by the formula:

$$Nc=2^{n/2}$$

where:
Nc is the number of coarse/fine comparators, and
n is a number of binary digits in the digital output code.

5. The analog-to digital converter of claim 1 wherein each coarse/fine comparator further includes:
a first capacitor having a first capacitor plate connected to the second input and a second capacitor plate;
a first switch having a first contact terminal connected to the second capacitor plate of the first capacitor, a second contact terminal connected to the first input, and a control input connected to the switch timing control input to selectively connect the sampled and held input voltage signal to the second plate of the first capacitor;
a second capacitor having a first capacitor plate and a second capacitor plate;
a second switch having a first contact terminal connected to the first input, a second contact terminal connected to the second plate of the second capacitor, and a control input connected to the switch timing control input to selectively connect the sampled and held input voltage signal to the second plate of the first capacitor;
a third switch having a first contact terminal connected to the second input, a second contact terminal connected to the second plate of the second capacitor, and a control input connected to the switch timing control input to selectively connect the first reference voltage source to the first plate of the second capacitor;
a fourth switch having a first contact terminal connected to the first plate of the second capacitor, a second contact terminal connected to the third input terminal, and a control input connected to the switch timing control input to selectively connect the first plate of the second capacitor to the one fine output tap,
a third capacitor having a first capacitor plate and a second capacitor plate;
an amplifier circuit including an input terminal and an output terminal, whereby an amplifier output signal at the output terminal has a voltage level equal to a gain factor multiplied by an amplifier input signal at the input terminal;
a fifth switch having a first contact terminal connected to the second capacitor plate of the second capacitor, a second contact terminal connected to the first capacitor plate of the third capacitor, and a control input connected to the switch timing control input connected to the switch timing control input to selectively connect the second capacitor to the first capacitor plate of the third capacitor;
a sixth switch having a first contact terminal connected to the second capacitor plate of the first capacitor, a second contact terminal connected to first capacitor plate of the third capacitor, and a control input connected to the switch timing control input to selectively connect the second capacitor plate of the first capacitor to the first capacitor plate of the third capacitor;
a seventh switch having a first contact terminal connected to the first plate of the third transistor, a second contact terminal connected to the fourth input, and a control input connected to the switch timing control input to selectively connect the first capacitor plate of the third capacitor plate to the one coarse output tap of the plurality of coarse output taps;
an eighth switch having a first contact terminal connected to the first plate of the third capacitor, a second contact terminal connected to the fifth terminal, and a control input connected to the switch timing control input to selectively connect the first capacitor plate of the third capacitor to the second coarse output tap; and
a ninth switch having a first contact terminal connected to the input terminal of the amplifier, a second contact terminal connected to the output terminal of the amplifier, and a control input connected to the switch timing control input to selectively connect the output terminal of the amplifier to the input terminal of the amplifier to establish a threshold biasing voltage at said input terminal.

6. The analog-to-digital converter of claim 5 wherein the timing input signals comprise:
a first activation signal at a first time to activate the first, second, third and seventh switches to provide a coarse sampling of the sampled and held input voltage signal, and to activate the ninth switch to establish the threshold biasing voltage at the input terminal of the amplifier;
a second activation signal at a second time to deactivate the first, second, third, seventh and ninth switches, to activate the fourth switch to initialize a fine reference voltage, and to activate the sixth switch to create the coarse output signal;
a third activation signal at a third time to activate the eighth switch to a coarse differential voltage, and to activate the ninth switch to establish the threshold biasing voltage at the input terminal of the amplifier; and
a fourth activation signal at a fourth time to deactivate the eighth and ninth switches, to activate the fifth switch to create the fine output signal.

7. The analog-to-digital converter of claim 6 wherein said timing input signal is repeated for each sampling and holding of the input voltage signal.

8. The analog-to-digital converter of claim 1 further comprising a plurality of error determining coarse/fine comparators whereby a first portion of the error determining coarse/fine comparators is appended to a first side of the plurality of coarse/fine comparators and a second portion of the error determining coarse/fine comparators is appended to a second side of the plurality of coarse/fine comparators, whereby the plurality of error determining coarse/fine comparators create an error signal indicating an error in the coarse output signal and indicating a corrective factor to be employed by the encoder to create a correct digital output code.

9. The analog-to-digital converter of claim 5 wherein the first, second, third, fourth, fifth, sixth, seventh, eighth and ninth switches are MOS transistors.

10. A multiple reference voltage comparator to provide a first digital logic output signal of a first logic level if an input signal has a level greater than a first reference voltage source and a second logic level if the input signal has a level less than the first reference voltage source, and to provide a second digital logic output signal of the first logic level if the input signal is greater than a second reference voltage source and the second logic level if the input signal is less than the second reference voltage source comprising:

- a first input terminal to receive the input signal;
- a second input terminal coupled to a common reference voltage source;
- a third input terminal connected to the second reference voltage source;
- a fourth input terminal connected to the first reference voltage source;
- a fifth input terminal connected to a third reference voltage source whereby said third reference voltage source differs from said first reference voltage source by an incremental voltage;
- a compare output to provide the first digital logic output signal at a first output time and the second digital logic output signal at a second output time;
- a switch timing control input to provide control timing signals;
- a first capacitor having a first capacitor plate connected to the second input terminal and a second capacitor plate;
- a first switch having a first contact terminal connected to the second capacitor plate of the first capacitor, a second contact terminal connected to input terminal, and a control input connected to the switch timing control input to selectively connect the input voltage signal to the second plate of the first capacitor;
- a second capacitor having a first capacitor plate and a second capacitor plate;
- a second switch having a first contact terminal connected to the first input terminal, a second contact terminal connected to the second plate of the second capacitor, and a control input connected to the switch timing control input to selectively connect the input voltage signal to the second plate of the first capacitor;
- a third switch having a first contact terminal connected to the second terminal input, a second contact terminal connected to the second plate of the second capacitor, and a control input connected to the switch timing control input to selectively connect the common reference voltage source to the first plate of the second capacitor;
- a fourth switch having a first contact terminal connected to the first plate of the second capacitor, a second contact terminal connected to the third input terminal, and a control input connected to the switch timing control input to selectively connect the first plate of the second capacitor to the second reference voltage source;
- a third capacitor having a first capacitor plate and a second capacitor plate;
- an amplifier circuit including an input terminal and an output terminal, whereby an amplifier output signal at the output terminal has a voltage level equal to a gain factor multiplied by an amplifier input signal at the input terminal;
- a fifth switch having a first contact terminal connected to the second capacitor plate of the second capacitor, a second contact terminal connected to the first capacitor plate of the third capacitor, and a control input connected to the switch timing control input connected to the switch timing control input to selectively connect the second capacitor to the first capacitor plate of the third capacitor;
- a sixth switch having a first contact terminal connected to the second capacitor plate of the first capacitor, a second contact terminal connected to first capacitor plate of the third capacitor, and a control input connected to the switch timing control input to selectively connect the second capacitor plate of the first capacitor to the first capacitor plate of the third capacitor;
- a seventh switch having a first contact terminal connected to the first plate of the third transistor, a second contact terminal connected to the fourth input terminal, and a control input connected to the switch timing control input to selectively connect the first capacitor plate of the third capacitor plate to the first reference source;
- an eighth switch having a first contact terminal connected to the first plate of the third capacitor, a second contact terminal connected to the fifth terminal, and a control input connected to the switch timing control input to selectively connect the first capacitor plate of the third capacitor to the third reference voltage source; and
- a ninth switch having a first contact terminal connected to the input terminal of the amplifier, a second contact terminal connected to the output terminal of the amplifier, and a control input connected to the switch timing control input to selectively connect the output terminal of the amplifier to the input terminal of the amplifier to establish a threshold biasing voltage at said input terminal.

11. The multiple reference voltage comparator of claim 10 wherein the timing input signals comprise:

- a first activation signal at a first time to activate the first, second, third and seventh switches to provide a first sampling of the sampled and held input voltage signal, and to activate the ninth switch to establish the threshold biasing voltage at the input terminal of the amplifier;
- a second activation signal at a second time to deactivate the first, second, third, seventh and ninth switches, to activate the fourth switch to initialize a second reference voltage level, and to activate the sixth switch to create the first digital logic output signal;
- a third activation signal at a third time to activate the eighth switch to a differential voltage, and to activate the ninth switch to establish the threshold biasing voltage at the input terminal of the amplifier; and
- a fourth activation signal at a fourth time to deactivate the eighth and ninth switches, to activate the fifth switch to create the second digital logic output signal.

12. A method for determining a voltage level of an analog input signal and creating a digital code representing said voltage level, comprising the steps of:

- sampling and hold said analog input signal;
- providing a plurality of coarse reference voltage levels, whereby each coarse reference voltage level differs from an adjacent coarse reference voltage level by a coarse increment;
- providing a plurality of fine reference voltage levels, whereby each fine reference voltage level differs from an adjacent fine reference voltage level by a fine increment;
- providing a common reference level that is a common voltage level for the coarse and fine voltage reference levels;
- subtracting each coarse reference voltage level from the voltage level of the analog input signal to create a coarse difference signal;

creating a coarse thermometer code from the course difference signal indicating which of the plurality of coarse reference voltage levels are greater than the voltage level of the analog input signal and which of the plurality of coarse reference voltage levels are less the voltage level of the analog input signal;

adding separately each one of the fine reference voltage levels to the voltage level of the analog input signal, subtracting the common voltage reference level, and subtracting the coarse reference voltage level adjacent to a largest coarse reference voltage level less than the voltage level of the analog input signal to form a fine difference signal;

creating a fine thermometer code from the fine difference signal indicating which of the plurality of fine reference voltage levels, when added to the largest coarse voltage level, are greater than the voltage level of the analog input signal and which of the plurality of fine reference voltage levels, when added the largest coarse voltage level, are less than the voltage level of the analog input signal; and creating from the coarse thermometer code and the fine thermometer code the digital code.

13. The method of claim 12 further comprising the steps of:

providing a first plurality of error determining fine reference voltage levels appended to a first side of the plurality of fine reference voltage levels, and a second plurality of error determining fine reference voltage levels appended to a second side of the plurality of fine reference voltage levels;

adding separately the first and second pluralities of error determining fine reference voltage levels to the voltage level of the analog input signal, subtracting the common voltage reference level, and subtracting the coarse reference voltage level adjacent to the largest coarse reference voltage level less than the voltage level of the analog input signal to form an error difference signal;

creating an error code from the error difference signal indicating any error in the coarse thermometer code; and correcting the digital code by decrementing a set of most significant bits for an error code indicating the coarse thermometer code is too large and incrementing the set of most significant bits for an error code indicating the coarse thermometer code is too small.

14. A multiple reference, switched capacitor voltage comparator to provide a plurality of digital logic output signals, whereby each digital logic output signal has a first logic level if an input signal has a voltage level greater than an arithmetic combination of at least one of a plurality of reference voltage sources and has a second logic level if the input signal has a voltage level less than the arithmetic combination of at least one of the plurality of reference voltage sources, comprising:

a compare input terminal to receive the input signal;

a plurality of reference terminals, whereby each reference terminal is connected to one of the plurality of reference voltage sources;

a compare output terminal to provide the plurality of digital logic output signals at separate output times;

a first plurality of capacitors, whereby each capacitor has a first capacitor plate connected to some of the plurality of reference terminals and a second capacitor plate;

a second plurality of capacitors, whereby each capacitor has a first capacitor plate and a second capacitor plate;

a coupling capacitor having a first capacitor plate and a second capacitor plate;

a first plurality of switches, whereby each switch has a first contact terminal connected to some of the reference terminals, a second contact terminal connected to the first capacitor plate of one of the second plurality of capacitors, and a control input connected to the switch timing control circuit to selectively connect one of the reference voltage sources to the first capacitor plate of the one of the second plurality of capacitors;

a second plurality of switches, whereby each switch has a first contact terminal connected to the compare input terminal, a second contact terminal connected to the second capacitor plate of one of the first plurality of capacitors and the second plurality of capacitors, and a control input connected to the switch timing control circuit to selectively connect the input signal to the second plate of the first plurality of capacitors and the second plurality of capacitors;

a third plurality of switches, whereby each switch has a first contact terminal connected to a junction of the contact terminal of one of the second plurality of switches and the first capacitor plate of one of the first and second plurality of capacitors, a second contact terminal connected to the first capacitor plate of the coupling capacitor, and a control input connected to the switch timing control circuit to selectively connect the first capacitor plate of one of the first and second plurality of capacitors to the first capacitor plate of the coupling capacitor;

a fourth plurality of switches, whereby each switch has a first contact terminal connected to one of the reference voltage sources, a second contact terminal connected to the first capacitor plate of the coupling capacitor, and a control input circuit to selectively couple one of the reference voltage sources to the first capacitor plate of the coupling capacitor;

an amplifier circuit having an amplifier input terminal connected to the second capacitor plate of the coupling capacitor and an amplifier output terminal connected to the compare output terminal, whereby said amplifier circuit has a high gain such that an output signal at the amplifier output terminal is a product of the high gain and a voltage present at the second capacitor plate of the coupling capacitor to form the digital logic signals; and a feedback switch having a first contact terminal connected to the amplifier output terminal, a second contact terminal connected to the amplifier input terminal, and a control input connected to the switch timing control circuit to selectively couple the amplifier output terminal to the amplifier input terminal to bias said amplifier input terminal to a threshold voltage level.

15. The multiple reference, switched capacitor voltage comparator of claim 14 wherein the switch timing control circuit selectively activates each switch of the first, second, third, and fourth plurality of switches and the feedback switch to arithmetically combine selected reference voltage sources and the input signal with the threshold voltage level to create a voltage level at the amplifier input terminal, which, when amplified, is one of the plurality of digital logic output signals.

\* \* \* \* \*